United States Patent [19]
Uda et al.

[11] Patent Number: 5,907,177
[45] Date of Patent: *May 25, 1999

[54] SEMICONDUCTOR DEVICE HAVING A TAPERED GATE ELECTRODE

[75] Inventors: Tomoya Uda; Akiyoshi Tamura, both of Osaka, Japan

[73] Assignee: Matsushita Electric Industrial Co.,Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/614,492

[22] Filed: Mar. 13, 1996

[30] Foreign Application Priority Data

Mar. 14, 1995 [JP] Japan ...................... 7-053118

[51] Int. Cl.⁶ .................. H01L 29/76; H01L 31/0328
[52] U.S. Cl. ............................... 257/412; 257/192
[58] Field of Search .................... 257/279, 280, 257/281, 282, 283, 284, 412, 413

[56] References Cited

U.S. PATENT DOCUMENTS

| | | | |
|---|---|---|---|
| 4,914,056 | 4/1990 | Okumura | 437/192 |
| 4,968,382 | 11/1990 | Jacobson et al. | 156/643 |
| 5,342,481 | 8/1994 | Kadomura | 156/659 |
| 5,532,507 | 7/1996 | Wada | 257/280 |
| 5,600,168 | 2/1997 | Lee | 257/412 |

FOREIGN PATENT DOCUMENTS

| | | | |
|---|---|---|---|
| 63-87773 | 4/1988 | Japan | 257/283 |
| 1-187876 | 7/1989 | Japan . | |
| 2-211639 | 8/1990 | Japan | 257/280 |
| 3-21031 | 1/1991 | Japan | 257/283 |
| 4-234116 | 8/1992 | Japan . | |
| 6-209018 | 7/1994 | Japan . | |

*Primary Examiner*—Wael M. Fahmy
*Attorney, Agent, or Firm*—McDermott, Will & Emery

[57] ABSTRACT

A WSi film is deposited on a semi-insulative GaAs substrate. Thereafter, a first Al mask and a second SiO$_2$ mask are formed such that these two masks overlap on the WSi film. A SF$_6$/CF$_4$ mixture, which contains a gas of SF$_6$ in an amount of more than 20%, is used to dry-etch the WSi film. The WSi film is T-shaped, in other words the WSi film becomes gradually downwardly narrower in lateral length. The second mask is stripped. A Γ-shaped gate electrode is formed by means of an anisotropic etching process. Subsequently, an isotropic etching process is carried out to reduce the gate length of the electrode down to 0.5 μm or less. Silicon ions are implanted to form individual n' layers. A through film is deposited. Silicon ions are implanted to form individual n⁺ layers.

8 Claims, 13 Drawing Sheets

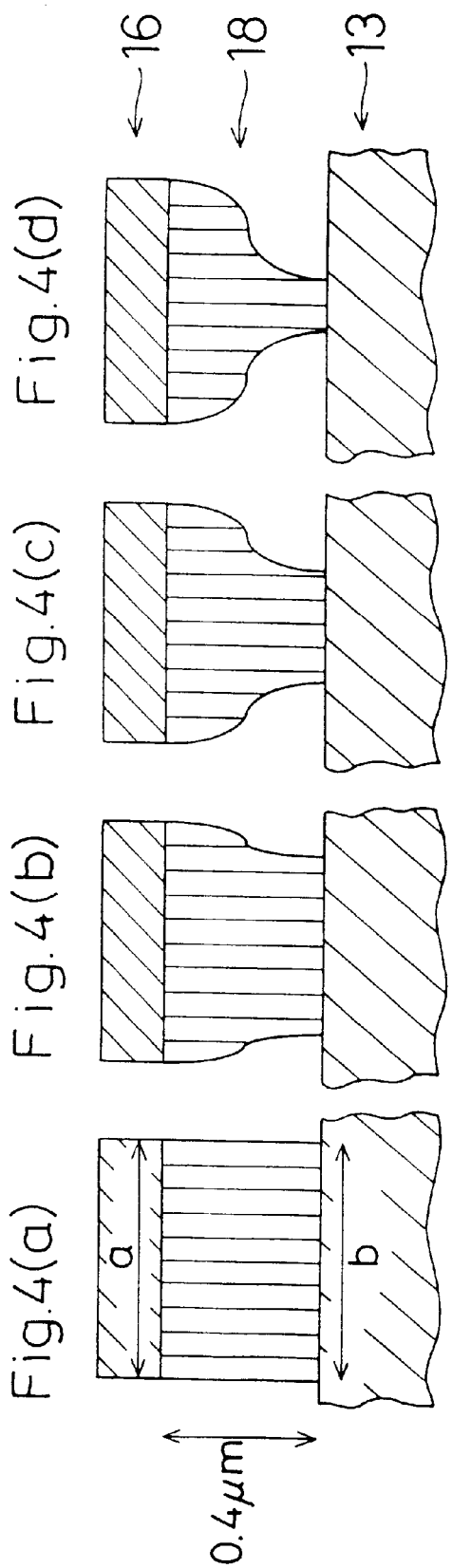
| FIGURE | MIXTURE RATIO OF SF6 (%) | a−b (μm) | a μm | b μm |
|---|---|---|---|---|
| 4a | 20 | 0 | 0.5 | 0.5 |
| 4b | 25 | 0.10 | 0.5 | 0.4 |
| 4c | 40 | 0.25 | 0.5 | 0.25 |
| 4d | 60 | 0.35 | 0.5 | 0.15 |

SEMICONDUCTOR DEVICE HAVING A TAPERED GATE ELECTRODE

BACKGROUND OF THE INVENTION

This intention relates to a compound semiconductor device such as GaAs FET (field-effect transistor) and in particular to a method of fabricating a fast compound semiconductor device for use by communication equipment and computers.

In the fabrication of GaAs FETs, a self-alignment process, which employs a refractory metal gate for the formation of an LDD (lightly-doped drain) structure, is widely used with a view to reducing both the parasitic source-drain resistance between gate and source and the parasitic source-drain resistance between gate and drain and with a view to increasing both the gate-source breakdown voltage and the gate-drain breakdown voltage.

An example of such a process is illustrated with reference to FIGS. 15a–g.

FIG. 15a shows a step of the fabrication of a FET. A photolithography process is employed and an n layer 13 acting as a channel layer is formed by implanting n-type impurity ions at a low concentration into a predetermined region of a semi-insulative GaAs substrate 11. This is followed by the deposit of a refractory metallic film 18a on the n layer 13. Further, a photolithography process is carried out to form an etch mask 16 on the refractory metal film 18a. This etch mask 16 is formed of, for example, aluminum (Al) and has a patten length of about 0.5 $\mu$m.

Next, as shown in FIG. 15b, an anisotropic etching process is performed using the etch mask 16, to pattern the refractory meatal film 18a to form on the n layer 13 a refractory metal gate electrode 18a which models itself in shape on the etch mask 16. The gate electrode 18 therefore has a gate length of about 0.5 $\mu$m, in other words the gate length of the gate electrode 18 and the pattern length of the etch mask 14 are the same.

Next, as shown in FIG. 15c, the gate electrode 18 is side-etched by means of an isotropic etching process, with the etch mask 16 left on top of the gate electrode 18. The gate length of the gate electrode 18, as a result, is reduced down to less than 0.5 $\mu$m.

Next, as shown in FIG. 15d, the etch mask 16 is stripped. Thereafter, a resist mask 30 is formed on the substrate 11 in such a way as to have an opening to a region where the n layer 13 is formed. Ions of an n-type impurity are implanted at a low concentration using the resist mask 30 and the gate electrode 18 as masks, to form an n' layer 19a on the source side and an n' layer 19b on the drain side. Hereinafter, the n' layer 19a is called the source-side (SS) n' layer while the n' layer 19b is called the drain-side (DS) n' layer.

An ion implantation process is carried out through an SiO$_2$ film which is hereinafter called the through (THRU) film 20. As shown in FIG. 15e, the THRU film 20 is deposited on the entire surface of the substrate 11. A resist mask 31 is formed on the THRU film 20 in such a way as to shield (A) a region extending from near the center of the gate electrode 18 to an area of the drain-side n' layer 19b and (B) regions other than the remaining area of the drain-side n' layer 19b and the entire area of the source-side n' layer 19a. Subsequently, ions of an n-type impurity are implanted at a high concentration. As a result of such an ion implantation process, a source-side (SS) n$^+$ layer 21a is formed in a substrate region on one side of the gate electrode 18 while a drain-side (DS) n$^+$ layer 21b is formed in another substrate region on the other side of the gate electrode 18. These n$^+$ layers 21a and 21b have the same width. At the same time, the n' layers 19a and 19b are defined such that the width of the n' layer 19b is greater than the width of the n' layer 19a. Each n$^+$ layer 21a, 21b has a greater depth than each n' layer 19a, 19b. Each n' layer 19a, 19b has a greater depth than the n layer 13.

Next, as shown in FIG. 15f, the resist mask 31 is stripped. Thereafter, a cap film 22, which is an SiO$_2$ insulating layer, is deposited over the substrate and the gate electrode 18. Subsequently, an annealing process is carried out to activate implanted impurity ions for the formation of active layers of the FET.

Next, as shown in FIG. 15g, source/drain electrodes 23, 23 are formed on the n$^+$ layers 21a and 21b, respectively.

The FET thus formed has a short gate length of less than 0.5 $\mu$m. This allows the FET to operate at a speed high enough to track high-frequency signals. Additionally, since the gate-drain distance is longer than the gate-source distance, this makes it possible to reduce the resistance of the source region. Further, the gate-drain breakdown voltage can be maintained at high level.

The above-described self-alignment process, however, suffers from the following drawbacks.

The first drawback is due to the fact that refractory metals usually have high resistivity. Therefore, the gate electrode 18, which has a short gate length and is composed of a refractory metallic film, has a high gate resistance, therefore preventing the FET from tracking high-frequency signals. The following approach may be taken in order to reduce the resistance of the gate. An insulating film for planarization is deposited on the entire surface of the substrate 11 of FIG. 15a. A photoresist is applied onto the insulating film. This photoresist is subjected to an etchback process by dry etching to expose the surface of a refractory metallic film forming the gate electrode 18. Subsequently, a low-resistivity metal layer is formed on the gate electrode 18. This approach, however, has some problems. For example, such an etchback process presents the problem that the substrate surface becomes non-uniform because of the deposit of the planarization insulating film and the dry etching process. As a result, it becomes difficult to uniformly expose the gate electrode 18 and the number of fabrication steps increases.

The second problem is due to the fact that the alignment accuracy of the lithography is about ±0.1 $\mu$m. For the case of FETs with a gate length of below 0.5 $\mu$m, there exists a possibility that an n$^+$ layer is formed, at the time of an impurity ion implantation step for the formation of source/drain regions, in a region near the gate electrode 18 within the DS n' layer 19b if the resist mask 31 undergoes an offset toward the drain in the FIG. 15e step.

The third problem arises when employing W or WSi with a great W composition as a refractory metal to reduce the gate resistance. Etching progresses fast in a direction along the grain boundary of crystals of a crystallized refractory metallic film in the FIG. 15c step in which the gate length is reduced down to less than 0.5 $\mu$m. As a result, the post-etch gate electrode is likely to have a disturbed side-surface shape. Therefore, a desirable gate length conforming to the design value may not be achieved.

SUMMARY OF THE INVENTION

Bearing in mind the above-described problems with the prior art techniques, the present invention was made. It is a first object of the present invention to provide a method capable of forming an electrode in such a way that the lateral length of the electrode becomes gradually downwardly smaller.

It is a second object of the present invention to provide a method capable of fabricating a compound semiconductor device having an electrode with adequately shaped side-surfaces. More specifically, a uniform etching technique is employed in reducing the lateral length of a refractory metallic film forming the electrode by side-etching.

It is a third object of the present invention to provide a compound semiconductor device with a gate length of below 0.5 µm capable of fast operations and its fabrication method.

The present invention provides a first method of fabricating a compound semiconductor device. This method comprises the steps of:

(a) depositing a metallic film on a compound semiconductor substrate;

(b) forming an etch mask on said metallic film to shield a part of said metallic film;

(c) patterning said metallic film, locally shielded by said etch mask, by means of a dry etching process employing an etch gas composed of a mixture of a first gas which forms a volatile substance by reaction with a constituent substance of said metallic film at the time of said dry etching process and a second gas which forms a deposit by reaction with said metallic film at the time of said dry etching process, to form an electrode which is T-shaped in a cross section orthogonal to the surface of said substrate wherein both sides of said electrode incline so that the lateral length of said electrode becomes gradually downwardly smaller.

The aspect of the above-described method is described. The metallic film is removed from the substrate surface by the first and second gases, while the deposit by the second gas, which prevents the progress of etching, adheres to the surface. At this time, ions of the first gas are heavily supplied to a surface of the metallic film parallel to the substrate. This facilitates removal of the deposit from the top, and etching progresses in the depth direction of the metallic film. Deposits, generated on the side-surfaces by the progress of the etching, are not removed. As a result, lateral etching by the removal action of each gas progresses only in the vicinity of the metallic film surface. The electrode is patterned from the metallic film into a T-like shape, wherein the top lateral length of the electrode is equal to the dimension of the etch mask and is gradually reduced downwardly.

It is preferred that in said step (b) a first etch mask and a second etch mask differing in etched characteristic are formed such that said second mask overlaps said first mask, that in said step (c) said metallic film is patterned using said first and second etch masks, and that said method further comprises:

(d) removing said second etch mask;

(e) removing a part of said T-shaped electrode that is not covered with said first etch mask by an etching process, to reshape said T-shaped electrode into an electrode which is Γ-shaped in said cross section wherein said reshaped electrode has a vertical side and an inclined side.

As a result of such arrangement, the electrode has an asymmetric cross section of letter Γ. Compound semiconductor devices taking advantage of the Γ-shaped electrode can be fabricated.

It is preferred that one of the first etch mask and the second etch mask is formed of a film which is essentially formed of aluminum and the other etch mask is formed of an $SiO_2$ film in the step (b).

Accordingly, such arrangement ensures that a compound semiconductor device with a Γ-shaped electrode is formed by making utilization of the difference in etched characteristic between the first mask and the second mask.

It is preferred that the metallic film is a WSi film and that the mixture of the step (c) contains a $SF_6$ gas as the first gas and a $CF_4$ gas as the second gas and the mixture contains the $SF_6$ gas in an amount of more than 20%.

The mixture contains the first gas ($SF_6$) with the action of etching only in an amount of more than 20%. Therefore, when etching the WSi film, sufficient lateral etching is obtained near the substrate surface. Additionally, it is possible to adjust the top and bottom lateral lengths of the electrode to respective target values by changing the mixture ratio of the first gas ($SF_6$) and the second gas ($CF_4$).

It is preferred that the metallic film is a WSi film, that the mixture contains a $SF_6$ gas as the first gas and a $CF_4$ gas as the second gas and the mixture includes the $SF_6$ gas in an amount of more than 20% in the step (c), and that a mixture of a gas of $SF_6$ and a gas of $CF_4$ is used as an etch gas and the mixture includes the $SF_6$ gas in an amount of less than 20% in the step (e).

Accordingly, in the electrode fabrication step, the electrode with a T-shape cross section is formed. Subsequently, one side-surface of this T-shaped electrode is vertically removed. This facilitates the formation of Γ-shaped electrodes.

It is preferred that the method further comprises (i) making the metallic film amorphous by introducing ions of an inert gas into the metallic film after the step (a) and (ii) performing, after the step (c), an isotropic etching process, with the etch mask left, to reduce the lateral length of said electrode from the top to the bottom of said electrode.

In the lateral length reduction step, the metallic film having a high melting point is made amorphous and isotropic etching is carried out. This etching process progresses uniformly at every location and the resulting electrode has a proper shape. Even when the ratio of the top lateral length and the bottom lateral length becomes relatively greater, the electrode's lateral length reduction step makes it possible to reduce the bottom lateral length. In other words, the shape of the electrode can be controlled with ease.

The present invention provides a second method of fabricating a compound semiconductor device with an electrode formed of a metallic film. This method comprises:

(a) depositing a metallic film on a compound semiconductor substrate;

(b) forming an etch mask on said metallic film to shield a part of said meal film;

(c) etching said metallic film with said etch mask to form an electrode;

(d) introducing ions of an inert gas into said metallic film to make said metallic film amorphous; and (e) performing an isotropic etching process, with said etch mask left, to reduce the lateral length of said electrode from the top to the bottom of said electrode.

It is preferred that the step of introducing ions of an inert gas into the metallic film is carried out, before the step of forming the etch mask, by implanting ions of an inert gas into the metallic film.

It is preferred that said step of introducing ions of an inert gas into said metallic film is carried out, after said step of forming said electrode, by irradiating nitrogen plasmas onto at least regions near said electrode's side-surfaces in a lateral direction with respect to said electrode.

In the lateral length reduction step, isotropic etching is performed, with the metallic film having a high melting point made amorphous. This etching process progresses uniformly at every location. The resulting electrode has a proper shape and side-surfaces with a good surface state.

The present invention provides a third method of fabricating a compound semiconductor device. This method comprises:

(a) a first step of forming a channel layer in a part of a compound semiconductor substrate;

(b) a second step of forming, on said substrate within said channel layer, an electrode of a metallic film wherein the lateral length of said electrode becomes gradually downwardly smaller in a cross section thereof orthogonal to the surface of said substrate.

(c) a third step of implanting ions of a first conductive type impurity into a region of said substrate located laterally from one side of said electrode and into a region of said substrate located laterally from the other side of said electrode wherein said electrode is used as a mask, to form a source-side impurity-diffused layer on one side of said channel layer and a drain-side impurity-diffused layer on the other side of said channel layer, respectively.

Accordingly, the electrode functions as a gate electrode of a FET, and source-drain signals are controlled by signals of the gate electrode. The gate electrode is formed having a T-shape cross section and the gate's bottom lateral length, i.e., the gate length, is easily made short. This provides a FET capable of fast operations suitable for high-frequency signal tracking.

It is preferred that, in the third step, the ion implantation is carried out in a direction greatly inclined from a direction orthogonal to the surface of the substrate towards the source wherein the electrode is used as a mask.

The aspect of the above is as follows. The distance between the source-side impurity-diffused layer and the electrode is short while the distance between the drain-side impurity-diffused layer and the electrode is great. This makes it possible to produce a FET with a low source resistance, i.e., a fast FET, and with a high drain breakdown voltage.

It is preferred that in the third step the ion implantation is bidirectionally carried out both in a direction greatly inclined from a direction orthogonal to the surface of the substrate towards the source and in a direction greatly inclined from the orthogonal direction towards the drain wherein the electrode is used as a mask.

Such arrangement provides the advantage that the dimensions of the channel layer can be further reduced. This speeds up the FET operation.

It is preferred that the third step includes:

(c-1) bidirectionally implanting, by making use of the electrode as a mask, ions of an impurity at a low concentration both in a direction greatly inclined from a direction orthogonal to the surface of the substrate towards the source and in a direction greatly inclined from the orthogonal direction towards the drain, to form a source-side lightly-diffused layer on one side of the channel layer and a drain-side lightly-diffused layer on the other side of the channel layer;

(c-2) implanting, by making use of the electrode as a mask, ions of an impurity at a high concentration in a direction orthogonal to the surface of the substrate, to form a source-side heavily-diffused layer on a side of the source-side lightly-diffused layer and a drain-side heavily-diffused layer on a side of the drain-side lightly-diffused layer.

Each impurity-diffused layer is made up of a lightly-diffused layer and a heavily-diffused layer. This achieves fine patterning, therefore providing a fast FET with a high breakdown voltage.

It is preferred that the method further comprises forming a through film to cover the substrate and the top and side-surfaces of the electrode after the step (c-1) and that the ion implantation of the step (c-2) is carried out at least from above the through film.

Fine control of the distance between the heavily-diffused layer and the electrode can be achieved by changing the through film thickness. This provides a fine FET which has resistance and breakdown voltage characteristics according to the application and the type.

It is preferred that the third step includes:

(c-1') implanting, by making use of the electrode as a mask, ions of an impurity at a low concentration in a direction greatly inclined from a direction orthogonal to the surface of the substrate towards the source, to form a source-side lightly-diffused layer and a drain-side lightly-diffused layer; and (c-2') implanting, by making use of the electrode as a mask, ions of an impurity at a high concentration in a direction orthogonal to the surface of the substrate, to form a source-side heavily-diffused layer on a side of the source-side lightly-diffused layer and a drain-side heavily-diffused layer on a side of the drain-side lightly-diffused layer.

It is preferred that the method further comprises forming a through film to cover the substrate and the top and side-surfaces of the electrode after the step (c-1'), and that in said step (c-2') said ion implantation is carried out from above said through film.

The distance between the source-side lightly-diffused layer and the electrode is short while both the distance between the drain-side lightly-diffused layer and the electrode and the distance between the drain-side heavily-diffused layer and the electrode are great. This makes it possible to form a fine FET with a low source resistance, i.e., a fast FET, and with a high drain breakdown voltage.

It is preferred that the method further comprises forming a resist mask to shield a region extending from near the center of the electrode to a part of the drain-side lightly-diffused layer before the step (c-2') and that in the step (c-2') the ion implantation is carried out from above the resist mask.

Fine control of the distance between the heavily-diffused layer and the electrode can be achieved by changing the resist mask width. This provides a fine FET which has resistance and breakdown voltage characteristics according to the application and the type.

It is preferred that in the second step (b) an electrode with a vertical side-surface and an inclined side-surface is formed having a Γ-shape cross section and that in the third step (c) a source-side impurity-diffused layer is formed in a region near the bottom of the vertical side-surface and a drain-side impurity-diffused layer is formed in a region near the bottom of the inclined side-surface.

As a result of such arrangement, the source-side impurity-diffused layer is formed close to the electrode while the drain-side impurity-diffused layer is formed apart from the electrode. This makes it possible to form a fine FET with a low source resistance, i.e., a fast FET, and with a high drain breakdown voltage.

It is preferred that the electrode of the second step (b) has a cross section which has a top lateral length of 0.5 $\mu$m or more, a bottom lateral length falling in the range between 0.05 μm and 0.5 μm, and a height falling in the range between 0.3 μm and 1.0 μm.

Such arrangement ensures that a fast compound semiconductor device with a low gate resistance is easily stably fabricated.

The present invention provides a compound semiconductor device. This compound semiconductor device comprises:

a compound semiconductor substrate; and an electrode which is formed on said substrate such that the lateral length of said electrode becomes gradually downwardly smaller in a cross section thereof orthogonal to the surface of said substrate.

By making utilization of such a T-shaped, small-sized electrode, a high-performance compound semiconductor device can be formed.

It is preferred that the compound semiconductor device further comprises:

a channel layer formed in a region of the substrate including a region directly under the electrode;

a source-side impurity-diffused layer formed in a region located laterally from one side of the channel layer; and a drain-side impurity-diffused layer formed in a region located laterally from the other side of the channel layer.

As a result of such arrangement, the gate length becomes much shorter, which, coupled with the mobility of the compound semiconductor, achieves a fast FET capable of tracking high-frequency signals.

It is preferred that the distance between the source-side impurity-diffused layer and the source-side edge of the electrode's bottom is shorter than the distance between the drain-side impurity-diffused layer and the drain-side edge of the electrode's bottom.

Such arrangement makes it possible to form a FET with a low source resistance and a high drain breakdown voltage.

It is preferred that the source-side impurity-diffused layer has a source-side lightly-diffused layer adjacent to one side of the channel layer, and the drain-side impurity-diffused layer has a drain-side lightly-diffused layer adjacent to the other side of the channel layer, and that the source-side impurity-diffused layer further has a source-side heavily-diffused layer which is formed outside and next to the source-side impurity-diffused layer, and the drain-side impurity-diffused layer further has a drain-side heavily-diffused layer which is formed outside and next to the drain-side impurity-diffused layer.

Each impurity-diffused layer is made up of a lightly-diffused layer and a heavily-diffused layer. This achieves fine patterning, therefore providing a fast FET with a high breakdown voltage.

It is preferred that the electrode is a Γ-shaped electrode with a vertical side-surface and an inclined side-surface, that the source-side impurity-diffused layer is formed laterally from the bottom of the vertical side-face, and that the drain-side impurity-diffused layer is formed laterally from the bottom of the inclined side-face.

The aspect of the above is as follows. Without any special arrangement, the source-side impurity-diffused layer is formed close to the electrode and the drain-side impurity-diffused layer is formed at a distance from the electrode because of the asymmetric electrode. This makes it possible to form an inexpensive compound semiconductor device having a low source resistance and a high drain breakdown voltage.

It is preferred that the electrode has a cross section which has a top lateral length of 0.5 μm or more, a bottom lateral length falling in the range between 0.05 μm and 0.5 μm, and a height falling in the range between 0.3 μm and 1.0 μm.

BRIEF DESCRIPTION OF THE DRAWINGS

FIGS. 4a–4d are partial cross-sectional views illustrating electrode shapes, which are results of the experiment, for various mixture ratios of $SF_6$ and $CF_4$.

DETAILED DESCRIPTION OF PREFERRED EMBODIMENTS

EMBODIMENT 1

Figure 1:
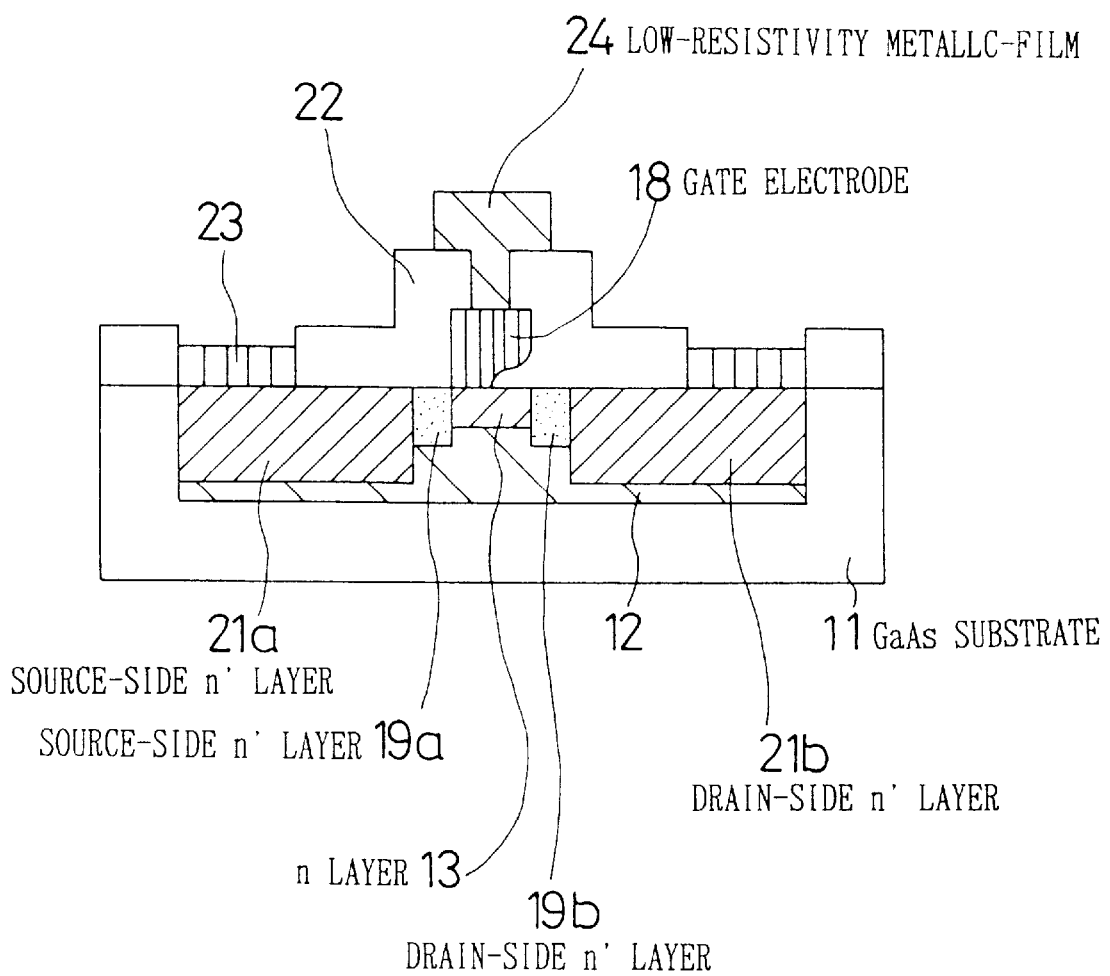
FIG. 1 is a cross-sectional view illustrating a compound semiconductor device in accordance with a first embodiment of the present invention.

Referring now to FIG. 1, a compound semiconductor device of the first embodiment is described. The present compound semiconductor device has a FET. This EFT includes the following elements: a gate electrode 18 formed on a semi-insulative GaAs substrate 11; an n layer 13 as a channel layer which is formed in a region of the GaAs substrate 11 located underneath the gate electrode 18; a source-side n⁺ layer 21a which is a heavily impurity-diffused layer formed in a region of the substrate 11 laterally from one side of the gate electrode 18; a drain-side n⁺ layer 21b which is a heavily impurity-diffused layer formed in a region of the substrate 11 laterally from the other side of the gate electrode 18; a source-side n' layer 19a which is a lightly impurity-diffused layer formed between the n⁺ layer 21a and the n layer 13; and a drain-side n' layer 19b which is a lightly impurity-diffused layer formed between the n⁺ layer 21b and the n layer 13. A cap film 22 is formed on the gate electrode 18. Source/drain electrodes 23 are formed in openings defined in regions of the cap film 22 above the n⁺ layers 21a and 21b. A low-resistivity metallic film 24 is formed to establish contact with the gate electrode 18 through the cap film 22.

The present compound semiconductor has the structural feature that the gate electrode 18 is Γ-shaped. Although the bottom of the gate electrode 18 lies close to the SS n' layer 19a, it is apart from the DS n' layer 19b. As a result of employing such an asymmetric gate electrode structure, the source resistance can be reduced and the gate-drain breakdown voltage can be increased.

Additionally, the gate electrode 18 has a Γ-shape cross section. As a result, in the gate electrode 18, the top lateral length is greater than the bottom lateral length (i.e., the gate length of the gate electrode 18). This facilitates the formation of the low-resistivity metallic film 24 on the gate electrode 18 for reducing the resistance of the gate electrode 18, therefore eliminating the need for etchback. Improvements in high-frequency signal trackability and breakdown voltage are accomplished, with no deterioration in the gate electrode's 18 shape, with no deterioration in the gate electrode's 18 characteristics, and with no complicated fabrication steps.

The gate electrode 18 may take a T-shaped structure, instead of a Γ-shaped structure. Such a T-shaped gate electrode is the electrode in which it branches off sidewise at its top, forming a shape of letter T. Such a T-shaped gate electrode is described later.

It is to be noted that the compound semiconductor device of the present embodiment is not limited to FETs. It is also to be noted that the electrode is not limited to gate electrodes.

The fabrication of the present compound semiconductor device is described.

Figure 2A:
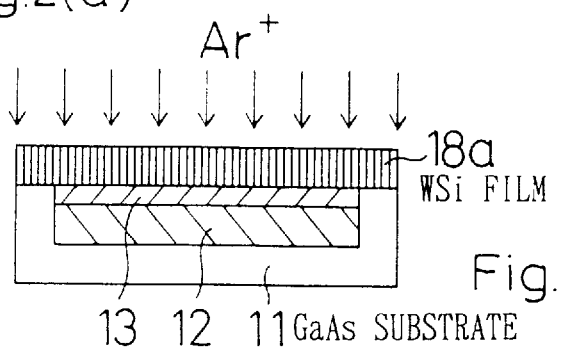
FIGS. 2a–2j are cross-sectional views illustrating steps of the fabrication of a compound semiconductor device in accordance with the first embodiment.

First, as shown in FIG. 2a, the GaAs substrate 11, which is a compound semiconductor, is provided. A resist mask having therein a required opening, not shown, is formed on the GaAs substrate 11. From above the resist mask, ions of Mg are implanted into the GaAs substrate 11 at an acceleration voltage of 180 keV at a dose of about $2.0 \times 10^{12}$ cm⁻², to form a p layer 12. Next, by reusing the resist mask, ions of Si are implanted at an acceleration voltage of 20 keV at a dose of about $2.0 \times 10^{13}$ cm⁻², to form on the p layer 12 the n layer 13 that acts as a channel layer. A WSi film 18a, which becomes a refractory metal gate electrode, is deposited on the surface of the GaAs substrate 11, having a film thickness of 400 nm. Ions of Ar as ions of an inert gas are implanted into the WSi film 18a at an acceleration voltage of 180 keV at a dose of about $5.0 \times 10^{13}$ cm⁻², whereupon the WSi film 18a becomes amorphous.

Figure 2B:
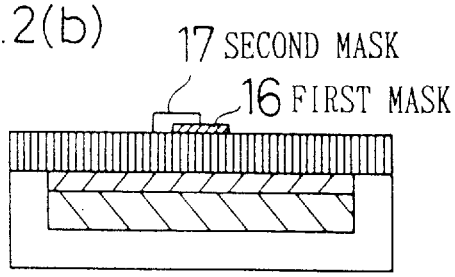

Next, as shown in FIG. 2b, in order to pattern the WSi film 18a to an gate electrode, a first mask 16 of Al is first formed on the WSi film 18a. A second mask 17 of SiO₂ is formed on the first mask 16 so that one side of the second mask 17 overlies the first mask 16 and the other side extends towards the source of the FET. The total mask length, in the channel direction, of the first and second masks 16 and 17 is about 1.5 μm.

Figure 2C:
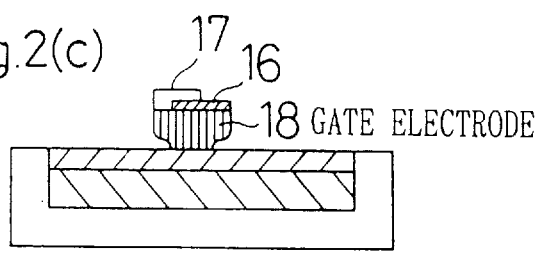

Next, as shown in FIG. 2c, a mixture of a gas of SF₆ and a gas of CF₄ is introduced onto the substrate 11. The WSi film 18a is dry-etched by means of RIE equipment, to form the substantially T-shaped gate electrode 18 with inclined side-surfaces. The gate electrode 18 has a cross section in which the lateral length of the electrode's top in contact with each mask 16, 17 is about 1.5 μm while the lateral length of the electrode's bottom in contact with the GaAs substrate 11 is about 0.5 μm. The lateral length of the gate electrode 18 having a T-shaped cross section is gradually downwardly reduced.

In the present embodiment, the WSi film 18a having a film thickness of about 400 nm is patterned. In such a patterning step, it is preferred that a SF₆/CF₄ mixture, which contains a gas of SF₆ in an amount of more than 20%, is employed. The reason is explained later. It is to be noted that the desirable mixture ratio of SF₆ and CF₄ varies with the film material and thickness.

Figure 2D:
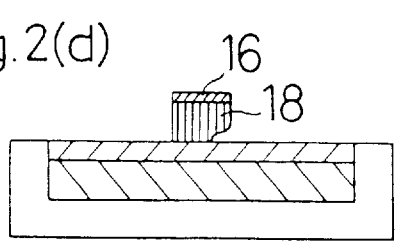

As shown in FIG. 2d, the second mask 17 is stripped by etching with hydrofluoric acid to expose a part of the surface of the gate electrode 18. Subsequently, an anisotropic dry etching process by means of RIE equipment with a SF₆/CF₄ mixture is carried out to remove only a part of the gate electrode 18 under the exposed surface. This anisotropic etching forms the gate electrode 18 having a cross-sectional shape of letter Γ. Therefore, the gate electrode 18 has side-surfaces on the FET source and drain sides, respectively, wherein the source-side side-surface stands upright while on the other hand the drain-side side-surface inclines. Further, the gate electrode 18 has a top lateral length of 1.0 μm and a bottom lateral length, or a gate length of 0.5 μm. If a SF₆/CF₄ mixture, which contains a SF₆ gas in an amount of less than 20%, is used, this achieves approximately 100% anisotropic etching.

Figure 2E:
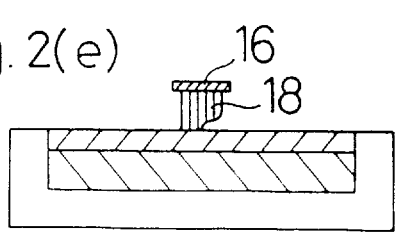

Next, as shown in FIG. 2e, an isotropic dry etching process (side-etch) by RIE is carried out in order that the entire of the gate electrode 18 is reduced in lateral length by approximately the same amount. For example, suppose the gate electrode 18 of FIG. 2c has a top lateral length of 1.0 μm and a bottom lateral length of 0.5 μm. If side-etching is carried out to such an extent that the gate electrode 18 has a top lateral length of 0.8 μm, then the gate electrode 18 has a bottom lateral length of about 0.3 μm. In other words, the electrode 18 has a gate length of 0.3 μm. A mixture of a gas of CF₄ and a gas of O₂ is used as an etch gas, and an etching process is carried out at a gas pressure of 600 mTorr at an RF power of about 40 W.

Figure 2F:
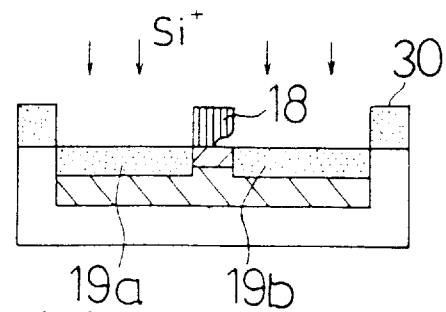

Next, as shown in FIG. 2f, the first mask 16 is removed. This is followed by formation of a resist mask 30 with openings to the regions where the n layer 13 and the p layer 12 are formed. By utilization of the resist mask 30 and the gate electrode 18 as masks, ions of Si are implanted into the GaAs substrate 11 at an acceleration voltage of 30 keV at a dose of about $5.0 \times 10^{12}$ cm⁻², to form the SS and DS n' layers 19a and 19b.

Figure 2G:
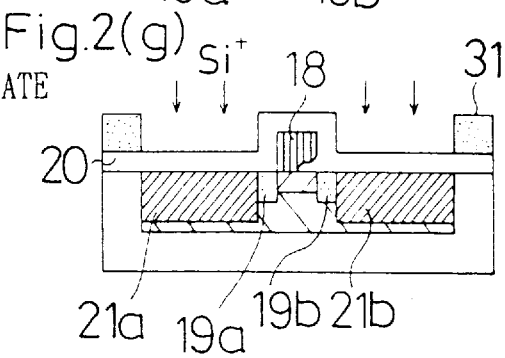

Next, as shown in FIG. 2g, the resist mask 30' is removed and a THRU film 20, which is an SiO₂ film having a film thickness of 200 nm, is formed on the GaAs substrate 11. Additionally, a resist mask 31 with openings to active regions is formed on the THRU film 20. Ions of Si are implanted into the GaAs substrate 11 at an acceleration voltage of 150 keV at a dose of about $5.0 \times 10^{13}$ cm$^{-2}$, to form the SS and DS n$^+$ layers 21a and 21b. Whereas the n' layer 19a becomes a region defined between the n$^+$ layer 21a and the n layer 13, the n' layer 19b becomes a region defined between the n$^+$ layer 21b and the n layer 13. The n' layer 19a lies close to the bottom of the gate electrode 18. On the other hand, the n' layer 19b lies apart from the bottom of the gate electrode 18.

Figure 2H:
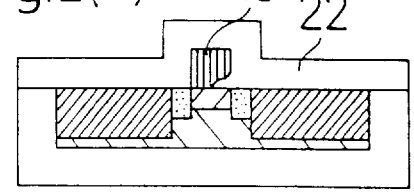

Next, as shown in FIG. 2h, the THRU film 20 is removed. Thereafter, the cap film 22 of SiO$_2$ is deposited on the surface of the GaAs substrate 11 and on the gate electrode 18. An annealing treatment is carried out at 800 degrees centigrade for about 15 minutes, to activate individual impurity ion-implanted layers, namely the n layer 13, the n' layers 19a and 19b, and the n$^+$ layers 21a and 21b.

Next, as shown in FIG. 21, opening are formed in portions of the protective layer 22 on the n$^+$ layers 21a and 21b. Thereafter, a AuGe.Ni.Au layer is deposited in these openings to form respective source/drain electrodes 23.

Figure 2I:
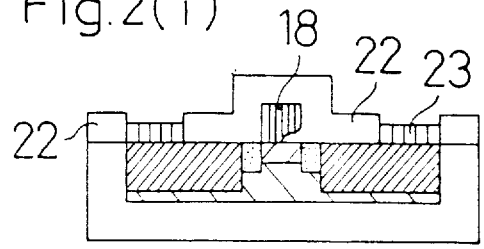
Figure 2J:
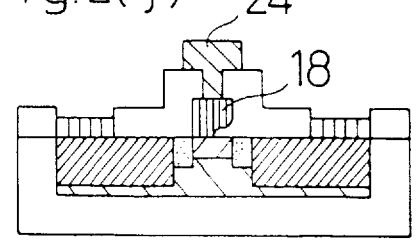

Next, as shown in FIG. 2j, an opening is formed in a portion of the cap film 22 on the gate electrode 18. Thereafter, a Ti.Au evaporation process is carried out to fill the opening and to deposit all over the substrate a Ti.Au film in which the Ti film has a thickness of about 50 nm and the Au film has a thickness of about 300 nm thick. A resist mask is formed on the Ti.Au film. The Ti-Au film is patterned by means of an ion milling process with Ar ions, to form on top of the gate electrode 18 the low-resistivity metallic film 24 composed of the Ti.Au film.

The compound semiconductor device fabrication method of the present embodiment facilitates FET-carrying compound semiconductor device formation (see FIG. 1).

In the above-described fabrication method, Ar ions as inert gas ions are implanted into the surface of the WSi film 18a, whereupon the WSi film 18a becomes amorphous. An alternative to such arrangement is described. An anisotropic dry etching process is carried out to form a Γ-shaped gate electrode 18. Subsequently, plasmas of N$_2$ are irradiated in a situation as shown in FIG. 2d, to make a region, which extends from both side-surfaces of the gate electrode 18 to near the gate electrode's 18 surface, amorphous. This is applicable also in the second and third embodiments which are described later.

In the present embodiment, the FIG. 2e step for reducing the lateral length of the gate electrode 18 employs a mixture of CF$_4$ and O$_2$. Instead, either SF$_6$ gas alone or a mixture of SF$_6$ and O$_2$ may be used.

Etching in the FIG. 2c fabrication step for forming a T-shaped electrode is examined. The present embodiment employs a gas of SF$_6$ that is the gas for isotropic etching in usual conditions. When used in an etching process by means of RIE equipment, SF$_6$ reacts with a WSi film to form no deposit but a volatile substance. Therefore, the WSi film is etched away in both the vertical and lateral directions. On the other hand, when used in an etching process by means of RIE equipment, CF$_4$ reacts with a WSi film to remove it and produces a polymer. This polymer provides protection to the sides of a recess resulting from the etching of the Wsi film. In this way, anisotropic etching is achieved.

The present embodiment uses a mixture of SF$_6$ and CF$_4$, and it is presumed that the WSi film 18a is patterned in the processing shown in FIGS. 3a–d. It is to be noted that FIGS. 3a–d are enlarged cross-sectional views of a side-surface of the WSi film 18a at one edge of the first mask 16 of Al.

Figure 3A:
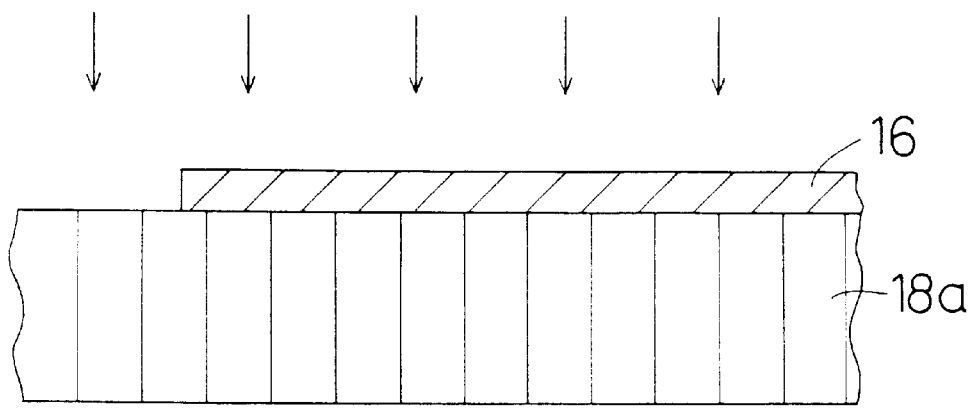
FIGS. 3a–3d are partial cross-sectional views useful in understanding the action of etching at the time of the patterning of a WSi film for the formation of a T-shape electrode.
Figure 3B:
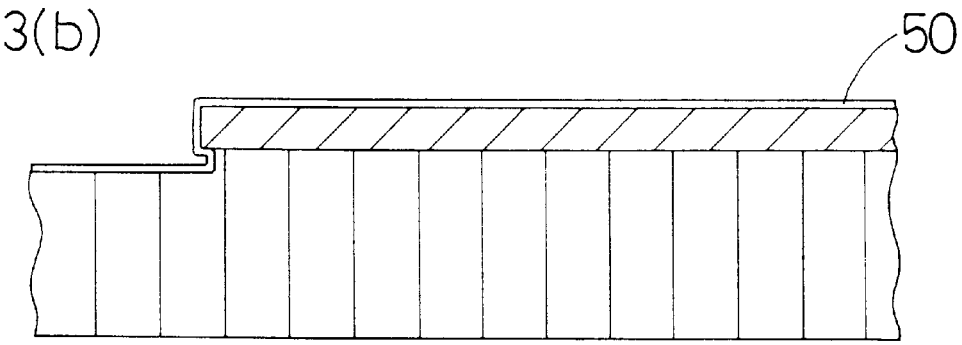
Figure 3C:
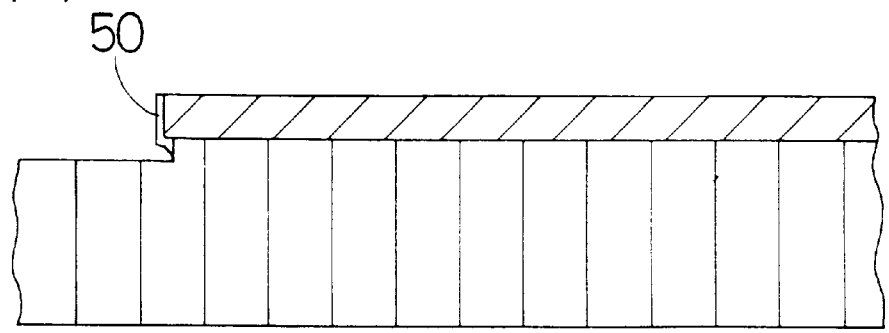
Figure 3D:
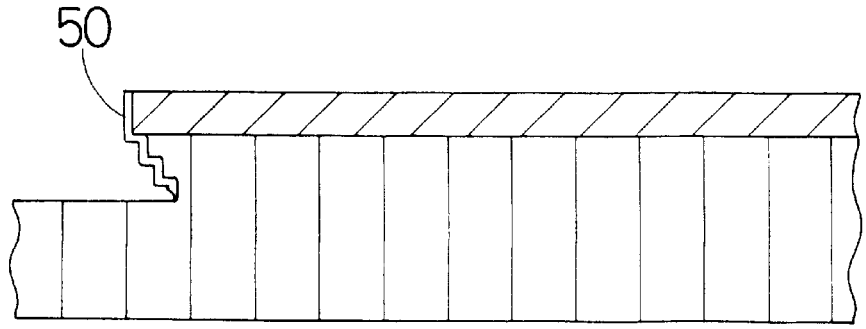

First, an etching process starts as shown in FIG. 3a. A deposit 50 adheres to the mask 16 and to the WSi film 18a (see FIG. 3b). Under non-high pressure conditions, ions of an etch gas that collide with the surface of the WSi film 18a have the greatest velocity component in a direction normal to the WSi film 18a. Therefore, as shown in FIG. 3c, the impact of collision between etch gas ions (i.e., ones that collide perpendicularly with the WSi film 18a) and the WSi film 18a removes the deposit 50 on the top of the WSi film 18a. The deposit 50 adhered onto the side surfaces of the WSi film 18a are not removed. Even if etching progresses in the vertical direction, the side-surface is not etched because of protection provided by the adhered deposit 50. Only portions of the WSi film 18a to be removed are etched away vertically, and obliquely inwardly at the corner. In this way, the action of the etching of the WSi film 18a, the action of the adhesion of the deposit 50, and the action of the removal of the deposit 50 by ion impact all progress simultaneously to etch the WSi film 18a. As a result, a pattern of microsteps is formed (see FIG. 3d). As etching progresses, the lateral length of a projection of the WSi film 18a (i.e., a gate electrode) becomes gradually narrower. In this way, the gate electrode 18 having a T-shape cross section is formed (see FIG. 2c).

If the top lateral length of the gate electrode 18 (i.e., the lateral length of the Al mask r6) is 'a' and the bottom lateral length of the gate electrode 18 is 'b', then the difference between 'a' and 'b', i.e., (a–b), depends on the ratio of the intensity of the RIE isotropic etching with the intensity of the RIE anisotropic etching. Additionally, the ratio depends on the mixture ratio of SF$_6$ and CF$_4$. Changing the mixture ratio of (A) SF$_6$ that produces only a volatile substance at the time of dry etching and achieves isotropic etching and (B) CF$_4$ that produces a deposit at the time of dry etching and achieves anisotropic etching, makes it possible to control the cross-sectional shape of the gate electrode 18.

FIGS. 4a–d depict different cross-sectional shapes of the gate electrodes 18 obtained as results of gate electrode formation tests for various SF$_6$/CF$_4$ mixture ratios as shown in the table. In these tests, for electrode gate formation, only the first mask 16 of Al was used as an etch mask and RIE equipment as an etching tool was used to pattern WSi films having a film thickness of 400 nm (gas pressure: 20 mTorr; RF power: 100 W). The table of FIG. 4 shows the amount of SF$_6$ on a percentage basis, the top lateral length of the gate electrode 18, 'a', the bottom lateral length of the gate electrode 18, 'b', and the difference between 'a' and 'b', (a–b). As can be seen from FIG. 4a, if the mixture has SF$_6$ in an amount of 20%, then 'a'='b'. In other words, almost only the action of anisotropic etching is achieved to form a gate electrode with side-surfaces perpendicular to the substrate surface. As the SF$_6$ amount exceeds 20% and further increases, the bottom lateral length, 'b', decreases. In other words, the bottom lateral length 'b' (i.e., the gate length) can be reduced by increasing the SF$_6$ amount. On the other hand, the gate length can be increased by reducing the SF$_6$ amount. If the WSi film 18a is thick, the gate length becomes relatively short even when the SF$_6$ amount is low.

In addition, various combinations of isotropic etch gas and anisotropic etch gas (e.g., a mixture of SF$_6$ gas and CH$_X$F$_{4-X}$ gas such as CHF$_3$ gas and CH$_2$F$_2$ gas, and a mixture of SF$_6$ and NF$_3$) may be used as an etch gas. An adequate type of etch gas can be selected and used according to, for example, the type of refractory metal used to form gate electrodes.

EMBODIMENT 2

A second embodiment of the present invention is described. FIGS. 5a–5e depict fabrication steps identical with the FIGS. 1a–1e fabrication steps of the first embodiment.

Figure 5A:
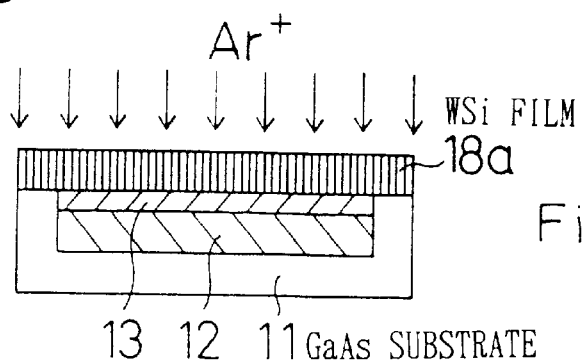
FIGS. 5a–5i are cross-sectional views illustrating steps of the fabrication of a compound semiconductor device in accordance with a second embodiment of the present invention.
Figure 5B:
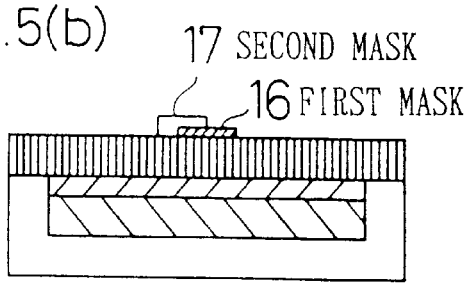
Figure 5F:
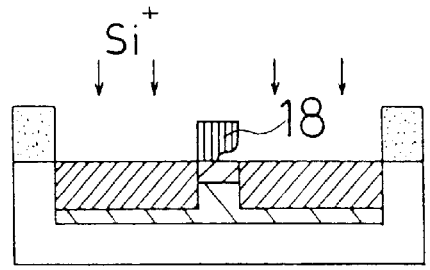
Figure 5C:
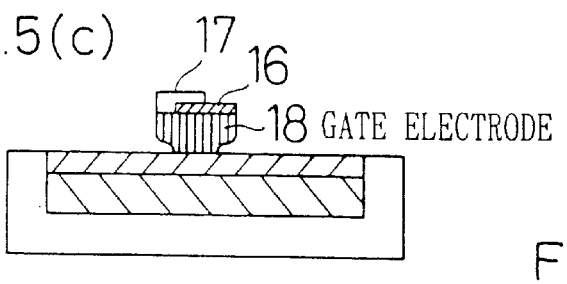
Figure 5G:
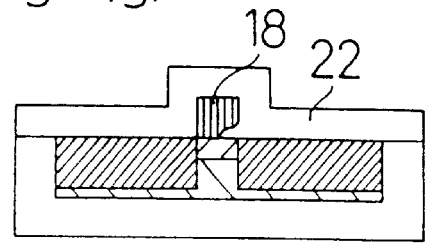
Figure 5D:
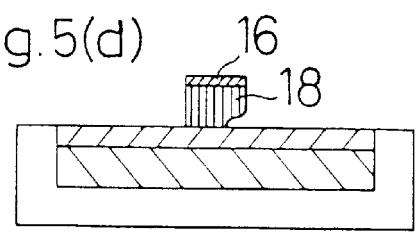
Figure 5H:
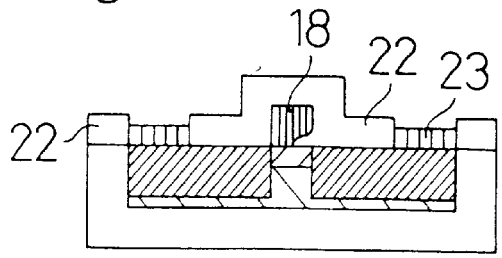
Figure 5E:
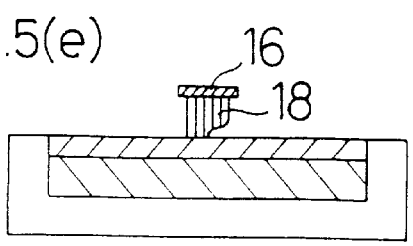
Figure 5I:
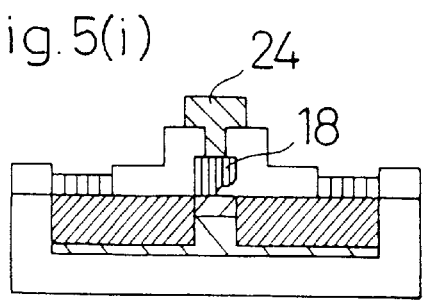

Referring to FIG. 5f, ions of Si are implanted in the GaAs substrate 11, not at a low concentration but at a high concentration, using the gate electrode 18 and the resist mask 30 as masks, to form the n⁺ layers 21a and 21b. For example, such an Si-ion implantation process is carried out at an acceleration voltage of 80 keV at a dose of about $3.0 \times 10^{13}$ cm$^{-2}$. Thereafter, the FIGS. 5g–5i fabrication steps identical with the FIGS. 2h–2j fabrication steps of the first embodiment are executed.

In the present embodiment, the SS n⁺ layer 21a lies close to the gate electrode 18 while the DS n⁺ layer 21b lies apart from the gate electrode 18. This allows the present embodiment to provide a compound semiconductor device having the same function as the first embodiment's compound semiconductor device.

EMBODIMENT 3

Figure 6A:
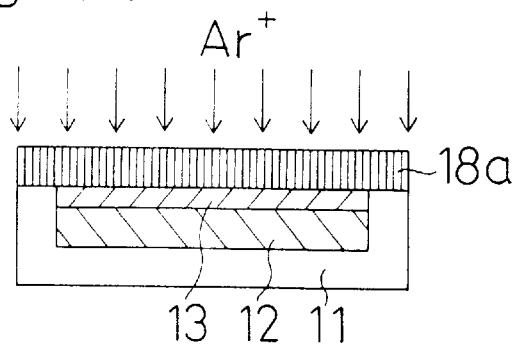
FIGS. 6a–6i are cross-sectional views illustrating steps of the fabrication of a compound semiconductor device in accordance with a third embodiment of the present invention.
Figure 6B:
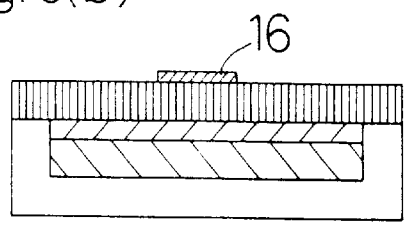
Figure 6C:
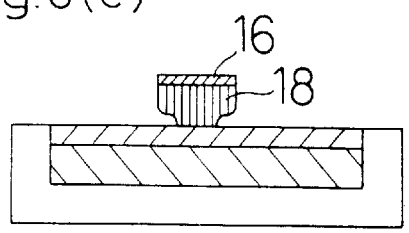

A third embodiment of the present invention is now illustrated. Fabrication steps shown in FIGS. 6a–6c almost identical with the FIGS. 2a–2c fabrication steps of the first embodiment, are carried out. In the present embodiment, however, only the first mask 16 of Al is formed as an etch mask. As depicted in FIG. 6c, the gate electrode 18 has side-surfaces which incline so that the gate electrode 18 has a substantially T-shaped cross section which becomes gradually narrower in its lateral length from its top having a lateral length equal to the first mask's 16 pattern length towards its' bottom. For example, the gate electrode 18 has a top lateral length of about 1 μm and a bottom lateral length of about 0.5 μm.

Figure 6D:
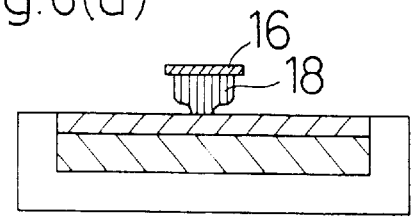

Next, as shown in FIG. 6d, a side-etch process is carried out using the same parameters as used in the FIG. 2d fabrication step of the first embodiment, to reduce the bottom lateral length of the gate electrode 18 (i.e., the gate length of the gate electrode 18), down to 0.5 μm or less. In this situation, the top lateral length is about 0.8 μm and the bottom lateral length is about 0.3 μm.

Figure 6E:
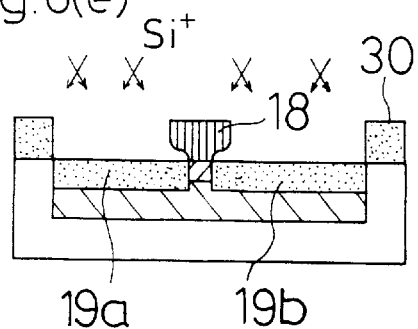

Next, as shown in FIG. 6e, the mask 16 is removed. Subsequently, the resist mask 30, which has therein an opening to a region where the n layer 13 and the p layer 12 are formed, is formed. By using the resist mask 30 and the gate electrode 18 as masks, ions of Si are implanted by means of a 2-step large inclination ion implantation process into the GaAs substrate 11 at an acceleration voltage of 30 keV at a dose of about $5.0 \times 10^{12}$ cm$^{-2}$, to form the SS and DS n' layers 19a and 19b.

Figure 6F:
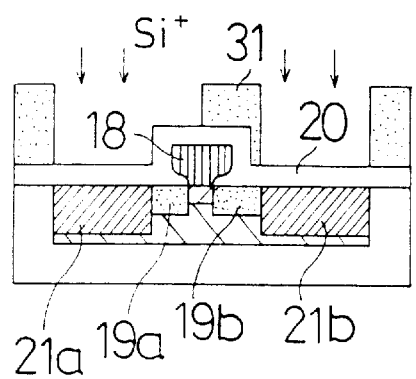

Next, as shown in FIG. 6f, the THRU film 20, which is an SiO₂ film having a thickness of about 200 nm, is formed on the GaAs substrate 11. The resist mask 31 is formed on the THRU film 20 to shield a region extending from near the center of the gate electrode 18 to a part of the DS layer 19b and regions other than the active regions. Subsequently, ions of Si are implanted from above the resist mask 31 into the GaAs substrate 11 at an acceleration voltage of 150 keV at a dose of about $5.0 \times 10^{13}$ cm$^{-2}$, to form the n+ layers 21a and 21b.

Figure 6G:
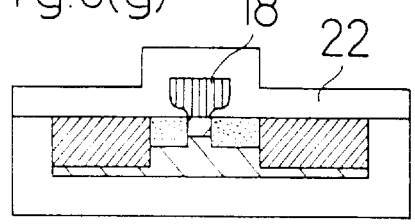

Next, as shown in FIG. 6g, the THRU film 20 is removed. Subsequently, the cap film 22, which is an SiO₂ layer, is deposited on the surface of the GaAs substrate 11 and on the gate electrode 18. An annealing treatment is carried out at 800 degrees centigrade for about fifteen minutes, to activate the ion-implanted layers, namely the n layer 13, the n' layers 19a and 19b, and the n⁺ layers 21a and 21b.

Figure 6H:
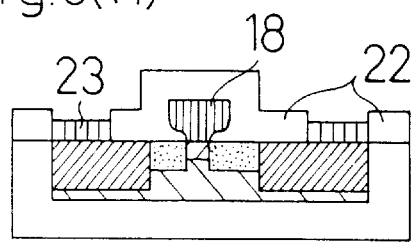

Openings to the n⁺ layers 21a and 21b are formed in the cap film 22 (see FIG. 6h). A AuGe.Ni.Au film is deposited in the openings to form the source/drain electrodes 23.

Figure 6I:
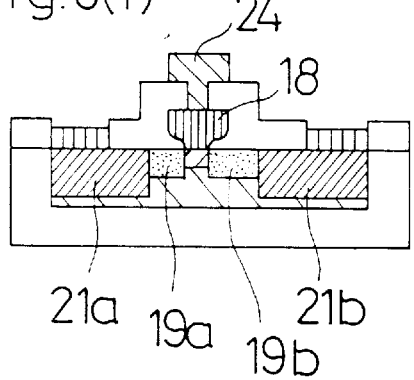

Next, as shown in FIG. 6i, an opening is formed in a portion of the cap film 22 on the gate electrode 18. Thereafter, a Ti.Au evaporation process is carried out to fill the opening and to deposit all over the substrate a Ti.Au film in which the Ti film has a thickness of about 50 nm and the Au film has a thickness of about 300 nm thick. A resist mask is formed on the Ti.Au film. The Ti-Au film is patterned by means of an ion milling process with Ar ions, to form on top of the gate electrode 18 the low-resistivity metallic film 24 composed of the Ti.Au film.

In the structure of a finished compound semiconductor device as shown in FIG. 6i, both the source-side n' layer 19a and the bottom of the gate electrode 18 lie close to each other. As a result, it becomes possible to reduce the resistance of the source and to secure high-frequency signal trackability. The gate-to-drain distance is greater than the gate-to-source distance, thereby improving the drain breakdown voltage. Additionally, the gate electrode 18 has a spacious top surface and the low-resistivity metallic film 24 is formed accurately.

In the FIG. 6e fabrication step, the n' layer 19 is formed by means of a large inclination ion implantation technique. Instead, the n' layer 19 may be formed by a normal inclination ion implantation technique. Even in such a case, if the gate electrode 18 is formed having a gate length (i.e., a bottom lateral length) as short as about 0.3 μm, this not only achieves high-speed operations capable of tracking high-frequency signals but also improves the drain breakdown voltage. One advantage of the use of large inclination ion implantation is that the resistance of the source can be reduced remarkably, thereby achieving higher-speed operations.

EMBODIMENT 4

A fourth embodiment of the present invention is described. Fabrication steps of FIGS. 7a–7d are carried out under the same conditions as the FIGS. 6a–6d fabrication steps of the third embodiment.

Figure 7A:
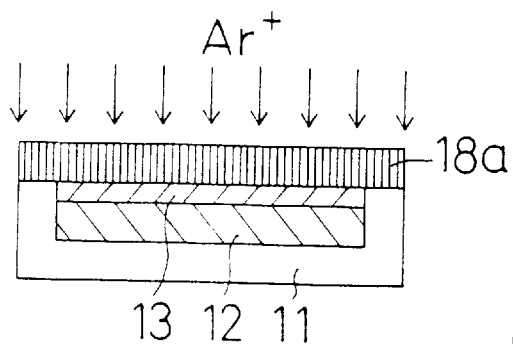
FIGS. 7a–7i are cross-sectional views illustrating steps of the fabrication of a compound semiconductor device in accordance with a fourth embodiment of the present invention.
Figure 7B:
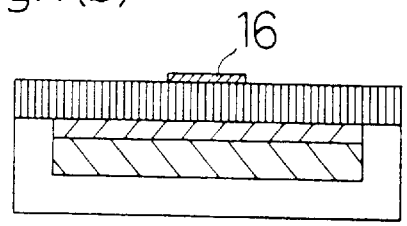
Figure 7C:
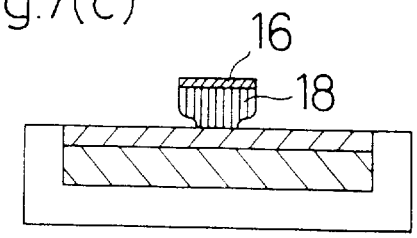
Figure 7D:
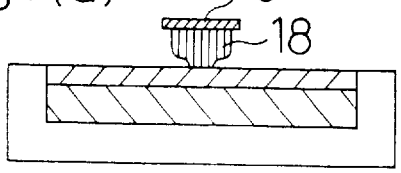
Figure 7E:
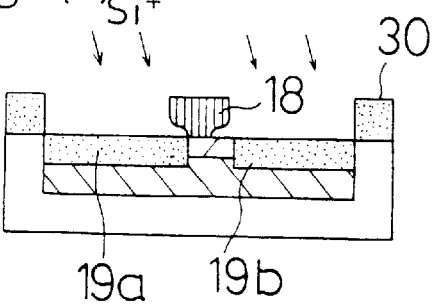

As shown in FIG. 7e, the first mask 16 is stripped. This is followed by formation of the resist mask 30 having therein an opening to the region where the n layer 13 and the p layer 12 are formed. Subsequently, by using the resist mask 30 and the gate electrode 18 as masks, ions of Si are implanted by means of a one-step large inclination ion implantation process into the GaAs substrate 11 in a direction inclined towards the source side at an acceleration voltage of 30 keV at a dose of about $5.0 \times 10^{12}$ cm$^{-2}$, to form the SS and DS n' layers 19b and 19b.

Figure 7F:
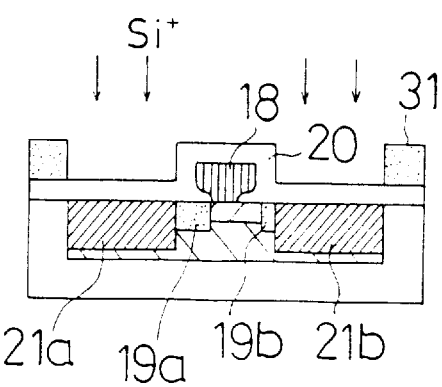

As shown in FIG. 7f, the resist mask 30 is stripped. Subsequently, the THRU film 20, which is an SiO₂ film having a thickness of 200 nm, is formed on the GaAs substrate 11. Formed on the THRU film 20 is the resist mask 31 with an opening to the region where the n' layer 19 is formed. Subsequently, ions of Si are implanted into the GaAs substrate 11 at an acceleration voltage of 150 keV at a dose of about $5.0 \times 10^{13}$ cm$^{-2}$, to form the SS and DS n⁺ layers 21a and 21b. At this time, a region lying between the n⁺ layer 21a and the n layer 13 and a region lying between the n⁺ layer 21b and the n layer 13 are defined as the n' layer 19a and as the n' layer 19b, respectively. While the SS n' layer 19a lies close to the bottom of the gate electrode 18, the DS n' layer 19b lies apart from the gate electrode 18.

Figure 7G:
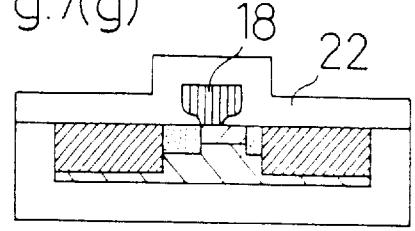
Figure 7H:
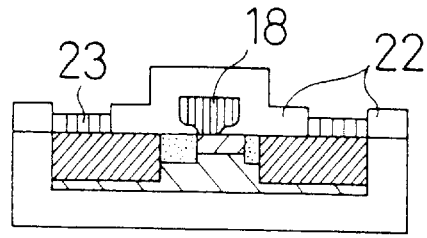
Figure 7I:
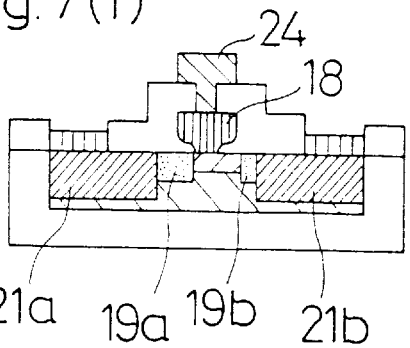

Thereafter, the FIGS. 7g–7i fabrication steps identical with the FIGS. 2h–2j fabrication steps of the first embodiment are carried out.

Referring to a final compound semiconductor device shown in FIG. 7i, although the gate electrode 18 is not shaped to Γ but to T, the relationship in location between the gate electrode 18, the SS n' layer 19a, and the DS n' layer 19b is basically the same as the first embodiment. Therefore, the present embodiment provides the same effect as the first embodiment.

The FIG. 7e fabrication step uses a large inclination ion implantation technique. A usual ion implantation technique may be used for impurity ion implantation. Even in such a case, the gate electrode 18 has a short gate length. This not only permits high-frequency operations but also eliminates the need for etchback.

EMBODIMENT 5

A fifth embodiment of the present invention is described with reference to FIGS. 8a–8i. The FIGS. 8a–8d fabrication steps identical with the FIGS. 6a–6d fabrication steps of the third embodiment are carried out.

Figure 8A:
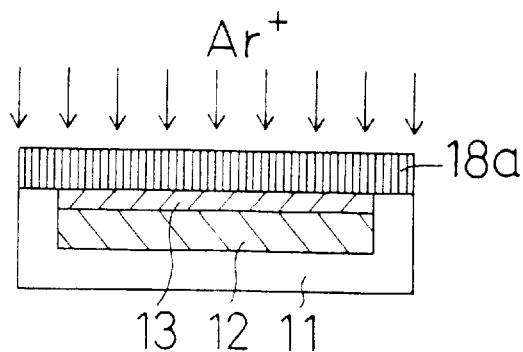
FIGS. 8a–8i are cross-sectional views illustrating steps of the fabrication of a compound semiconductor device in accordance with a fifth embodiment of the present invention.
Figure 8B:
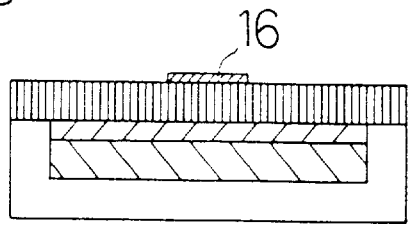
Figure 8C:
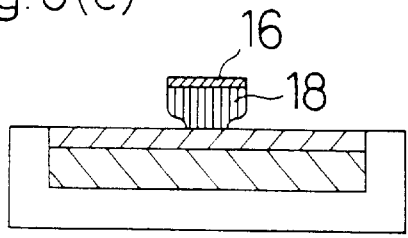
Figure 8D:
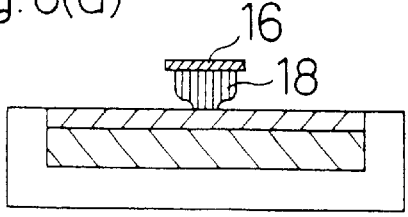
Figure 8E:
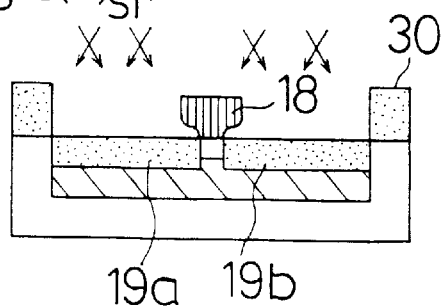
Figure 8F:
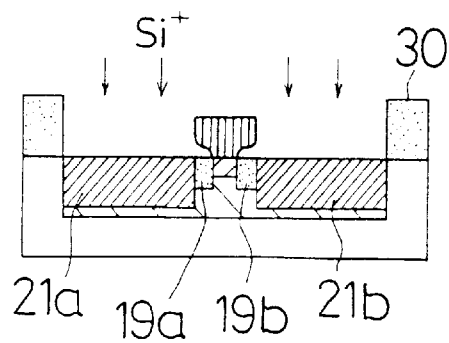

As shown in FIG. 8e, the first mask 16 is stripped. This is followed by forming the resist mask 30 having an opening to the region where the n layer 13 and the p layer 12 are formed. Subsequently, by using the resist mask 30 and the gate electrode 18 as masks, ions of Si are implanted by a two-step large inclination ion implantation technique into the GaAs substrate 11 at an acceleration voltage of 30 keV at a dose of about $5.0\times10^{12}$ cm$^{-2}$, to form the SS and DS n' layers 19a and 19b.

Next, by reusing the resist mask 30, ions of Si are implanted from above the mask 30 into the GaAs substrate 11 at an acceleration voltage 150 keV at a dose of about $5.0\times10^{13}$ cm$^{-2}$, to form the n$^+$ layers 21a and 21b. Note that no through films are formed in the present embodiment.

Figure 8G:
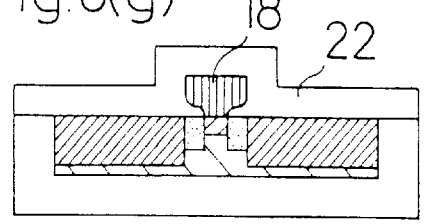
Figure 8H:
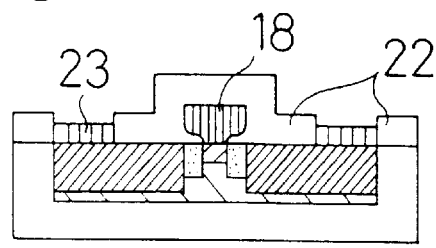
Figure 8I:
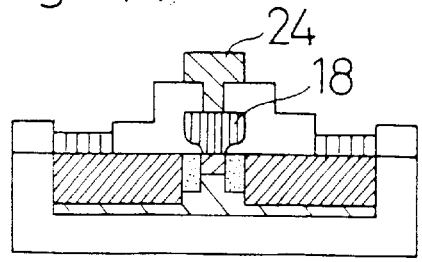

Thereafter, the FIGS. 8g–8i fabrication steps identical with the FIGS. 2h–2j fabrication steps of the first embodiment are carried out.

Referring to a final compound semiconductor device shown in FIG. 8i, the n' layers 19a and 19b are symmetrical in shape, so are the n$^+$ layers 21a and 21b. A FET fabricated in accordance with the present embodiment therefore has a low drain breakdown voltage in comparison with the first to fourth embodiments' FETs. However, the gate electrode 18 of the present embodiment lies close to the SS n' layer 19a, which reduces the resistance of the source. Additionally, the distance between the n' layers 19a and 19b is short and the distance between the n$^+$ layers 21a and 21b is short. This permits high-speed operations capable of tracking high-frequency signals. One advantage of the present embodiment is that, without having to provide a through film, an LDD structure (i.e., the n' layers 19a, 19b and the n$^+$ layers 21a, 21b) can be formed.

In the present embodiment, no through films are formed at the time of implanting impurity ions to form the n$^+$ layers 21a and 21b. A through film may be formed as necessity requires, before implanting impurity ions for the formation of the n$^+$ layers 21a and 21b.

EMBODIMENT 6

A sixth embodiment of the present invention is described with reference to FIGS. 9a–9i. The FIGS. 9a–9e fabrication steps almost identical with the FIGS. 6a–6e fabrication steps of the third embodiment are carried out.

Figure 9A:
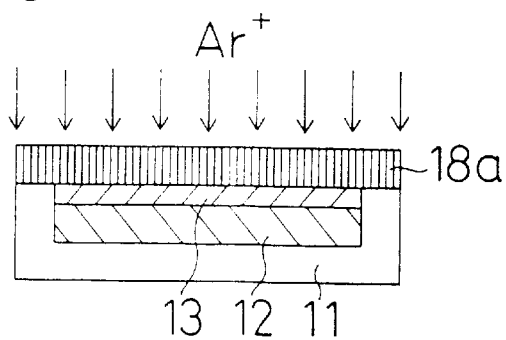
FIGS. 9a–9i are cross-sectional views illustrating steps of the fabrication of a compound semiconductor device in accordance with a sixth embodiment of the present invention.
Figure 9F:
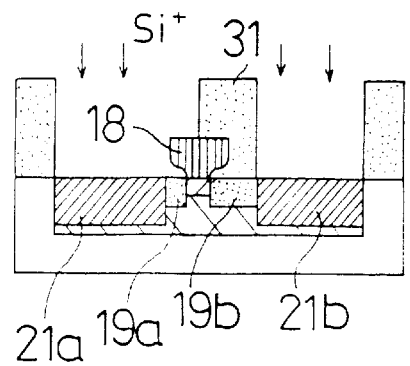
Figure 9B:
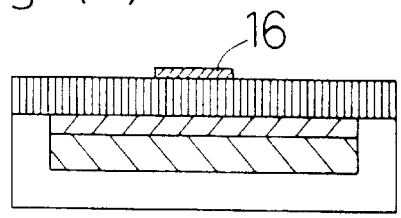

FIG. 9f shows a fabrication step that differs from the FIG. 6f fabrication step in that no THRU film 20 is formed. In the FIG. 9f fabrication step, the resist mask 31 is formed in such a way as to shield (A) a region extending from near the center of the gate electrode 18 to a part of the DS n' layer 19b and (B) regions other than the active regions. Ions of Si are implanted from above the mask 31 into the GaAs substrate 11 at an acceleration voltage of 100 keV at a dose of about $5.0\times10^{13}$ cm$^{-2}$, to form the n$^+$ layers 21a and 21b.

Figure 9G:
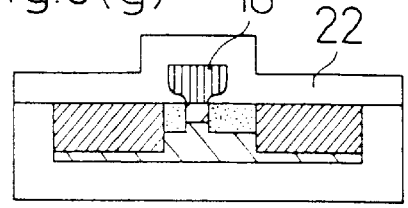
Figure 9C:
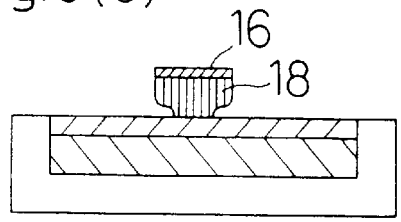
Figure 9H:
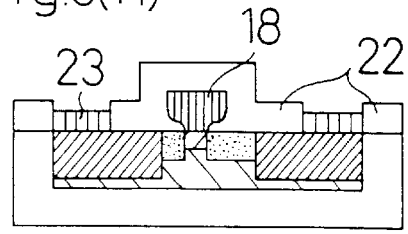
Figure 9D:
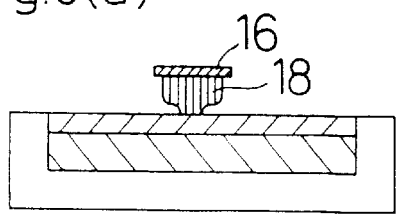
Figure 9I:
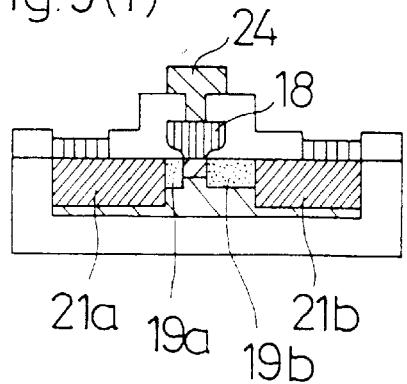

Thereafter, the FIGS. 9g–9i fabrication steps identical with the FIGS. 6g–6i fabrications steps of the third embodiment are carried out.

Referring to a final compound semiconductor device of FIG. 9i, the bottom of the gate electrode 18 and the SS n' layer 19a lie close to each other. This arrangement not only reduces the resistance of the source but also permits high-speed operations capable of tracking high-frequency signals. In addition to these advantages, the breakdown voltage of the drain can be improved. One advantage of the present embodiment is that the fabrication is simplified as a whole since no steps for forming through films are required.

Figure 9E:
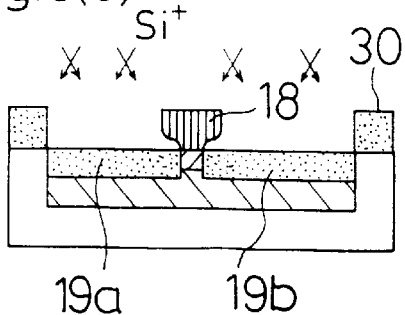

In the FIG. 9e fabrication step, the n' layer 19 is formed by means of a large inclination ion implantation technique. Instead, the n' layer 19 may be formed by a normal inclination ion implantation technique. Even in such a case, if the gate electrode 18 is formed having a gate length (i.e., a bottom lateral length) as short as about 0.3 μm, this not only achieves high-speed operations capable of tracking high-frequency signals but also improves the drain breakdown voltage. One advantage of the use of large inclination ion implantation is that the resistance of the source can be reduced, thereby achieving higher-speed operations.

EMBODIMENT 7

A seventh embodiment of the present invention is described with reference to FIGS. 10a–10i. Fabrication steps of FIGS. 10a–10e are carried out in the same way and under the same conditions as the previously described fabrication steps of FIGS. 7a–7e in the fourth embodiment.

Figure 10A:
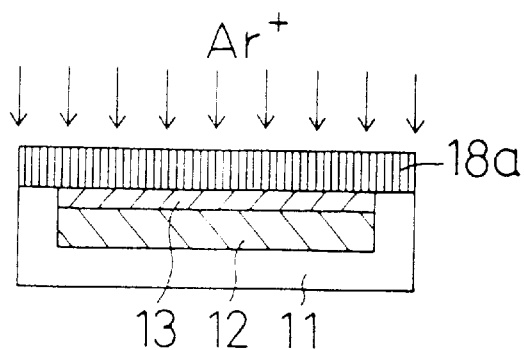
FIGS. 10a–10i are cross-sectional views illustrating steps of the fabrication of a compound semiconductor device in accordance with a seventh embodiment of the present invention.
Figure 10B:
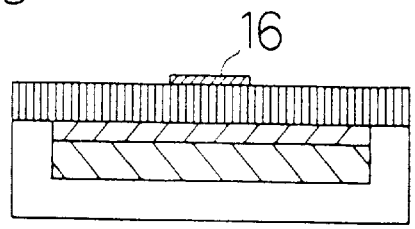
Figure 10C:
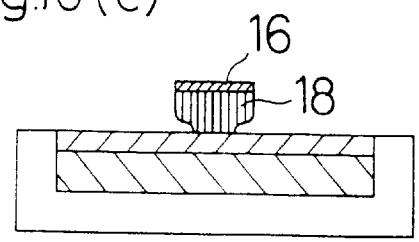
Figure 10D:
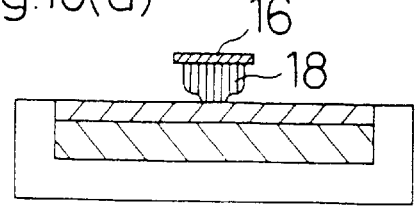
Figure 10E:
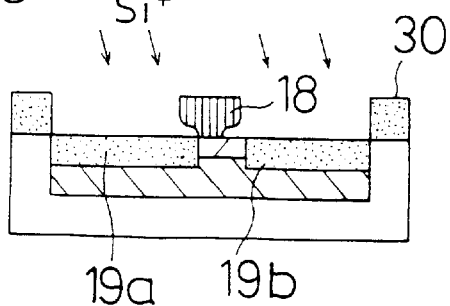
Figure 10F:
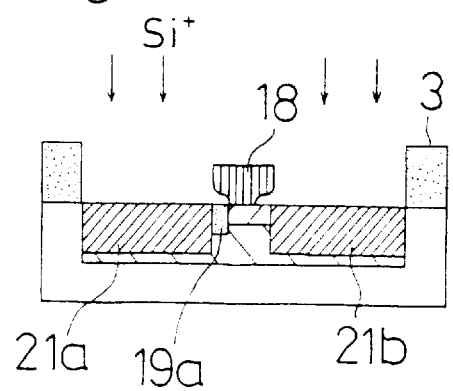

As shown FIG. 10f, the resist mask 30 is used as it is and ions of Si are implanted from above the mask 30 into the GaAs substrate 11 at an acceleration voltage of 100 keV at a dose of about $5.0\times10^{13}$ cm$^{-2}$, to form the SS and DS n$^+$ layers 21a and 21b. At this time, the n$^+$ layer 21b is formed more inwardly from the n' layer 19b formed in the previous step, as a result of which the DS n' layer 19b disappears. In other words, only the n$^+$ layer 21b is formed on the side of the drain. While the SS n' layer 19a lies close to the bottom of the gate electrode 18, the DS n$^+$ layer 21b lies apart from the gate electrode 18.

Figure 10G:
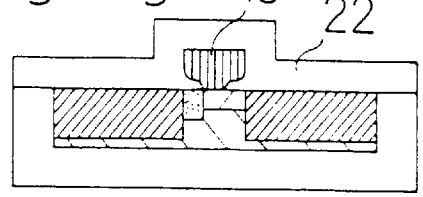
Figure 10H:
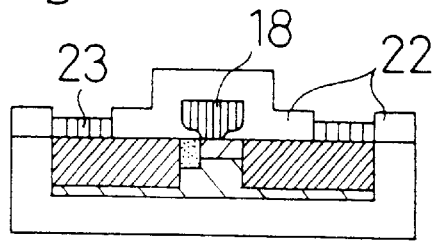
Figure 10I:
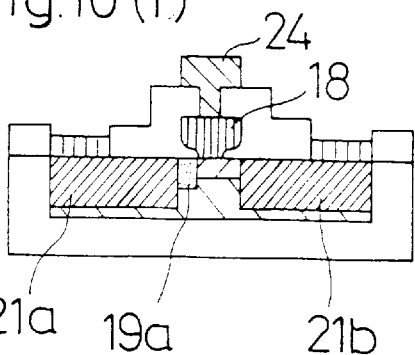

Thereafter, the FIGS. 10g–10i fabrication steps identical with the FIGS. 7g–7i fabrication steps of the fourth embodiment are carried out.

Basically, the present embodiment is able to provide the same effect as the fourth embodiment. One advantage of the present embodiment is that the fabrication is simplified as a whole since no steps for forming through films are required.

The FIG. 10e fabrication step uses a large inclination ion implantation technique. A usual ion implantation technique may be used for impurity ion implantation. Even in such a case, the gate electrode 18 has a short gate length. This not only permits high-frequency operations but also eliminates the need for etchback.

OTHER MANNERS

In addition to the above-described embodiments, there are the following manners. These manners are described with reference to respective drawing figures.

Figure 11:
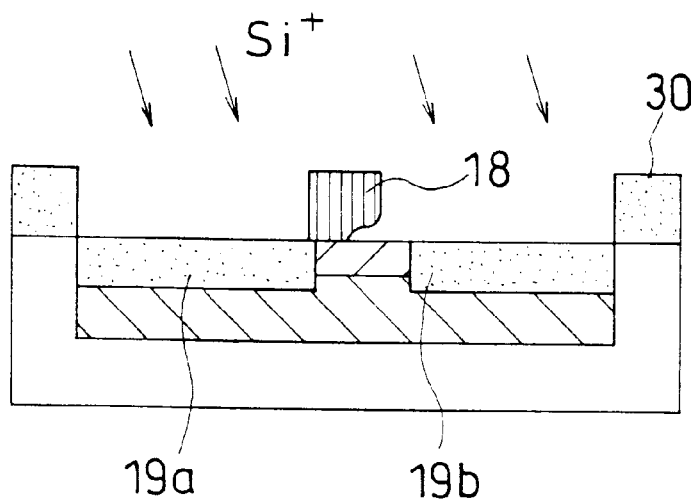
FIG. 11 is a cross-sectional view illustrating the structure of a compound semiconductor device formed in accordance with a modified step of the FIG. 2f fabrication step.

The first manner relates to the FIG. 2f fabrication step of the first embodiment (see FIG. 11). With regard to this fabrication step, it is possible to implant ions of Si into the GaAs 11 at a low concentration in a direction greatly inclined towards the source side, to form the DS n' layer 19b at a great distance from the gate electrode 18. Subsequently, the FIGS. 2g–2j fabrication steps are carried out. In comparison with the structure of FIG. 2j, the distance between the DS n' layer 19b and the gate electrode 18 becomes greater. The gate electrode 18 has an asymmetric structure. Such an asymmetric structure, coupled with the ion implantation carried out in an inclined direction, results in producing an improved structure having a low source resistance and a high drain breakdown voltage.

Figure 12:
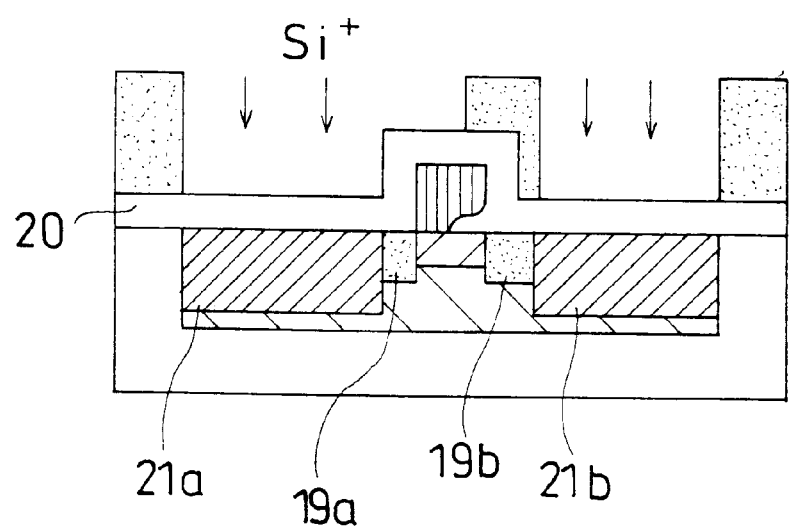
FIG. 12 is a cross-sectional view illustrating the structure of a compound semiconductor device formed in accordance with a modified step of the FIG. 2g fabrication step.

The second manner relates to the FIG. 2g fabrication step of the first embodiment (see FIG. 12). With regard to this fabrication step, it is possible to form on the THRU film 20 the resist mask 31 with an offset towards the drain side and to implant silicon ions at a high concentration from above the THRU film 20 and the resist film 31. Subsequently, the fabrication steps of FIGS. 2h–2j are carried out, whereupon the distance between the DS n$^+$ layer 21b and the gate electrode 18 becomes greater in relation to the FIG. 2j structure. This further improves the breakdown voltage of the drain.

Figure 13:
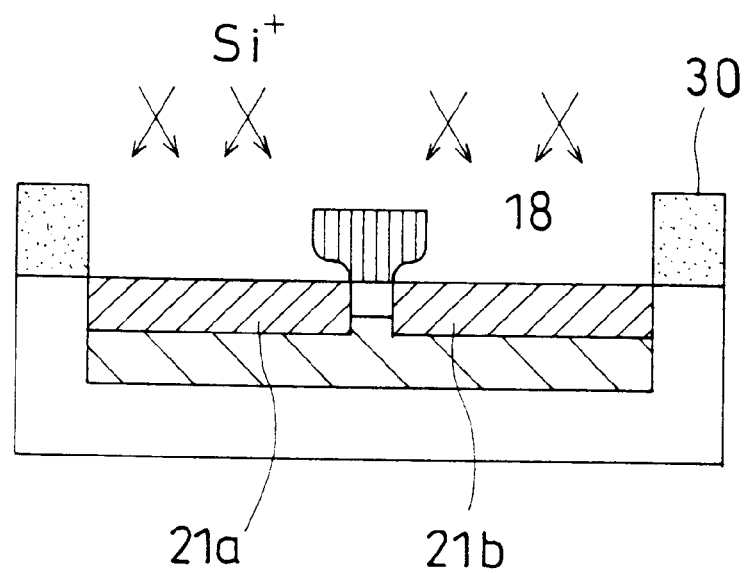
FIG. 13 is a cross-sectional view illustrating the structure of a compound semiconductor device formed in accordance with a modified step of the FIG. 6e fabrication step.

The third manner relates to the FIG. 6e fabrication step of the third embodiment (see FIG. 13). With regard to this fabrication step, it is possible to bidirectionally implant ions of Si (i.e., both in a direction greatly inclined towards the source side and in a direction greatly inclined towards the drain side) at a high concentration so as to form both the SS and DS n$^+$ layers 21a and 21b near the bottom of the gate electrode 18. Thereafter, skipping the FIG. 6f fabrication step, the fabrication steps of FIGS. 6g–6i are carried out to fabricate a compound semiconductor device with an SS impurity diffused layer and a DS impurity diffused layer in a symmetrical relationship. In this structure, the channel length becomes as short as the bottom lateral length of the gate electrode 18. This increases the rate of the operation. Since the top surface width of the gate electrode 18 is great, this reduces the resistivity value of the gate electrode 18. This is the basic effect of compound semiconductor devices with a T-shaped gate electrode.

The fourth manner relates to the FIG. 6f fabrication step of the third embodiment (not shown). With regard to this fabrication step, it is possible to implant ions of Si without forming the resist mask 31 on the THRU film 20. Thereafter, the fabrication steps of FIGS. 6g–6i are carried out, whereupon a compound semiconductor device is fabricated wherein the n' layers 19a on the source side and the n' layer 19b on the drain side are in a symmetrical relationship and the n$^+$ layer 21a on the source side and the n$^+$ layer 21b on the drain side are also in a symmetrical relationship. In such a case, there are some degradation of the source resistance and the drain breakdown voltage in comparison with the FIG. 6j structure. In this manner, however, there is formed an LDD structure and the bottom lateral length of the gate electrode 18 is made narrow. This not only achieves high-speed operations but also improves the drain breakdown voltage to some extent.

Conversely, in the FIG. 6f fabrication step, the resist mask 31 may be formed without forming the THRU film 20, before implanting impurity ions at a high concentration, to form the n$^+$ layers 21a and 21b. This provides a compound semiconductor device with an LDD structure with an extreme offset towards the source.

Figure 14:
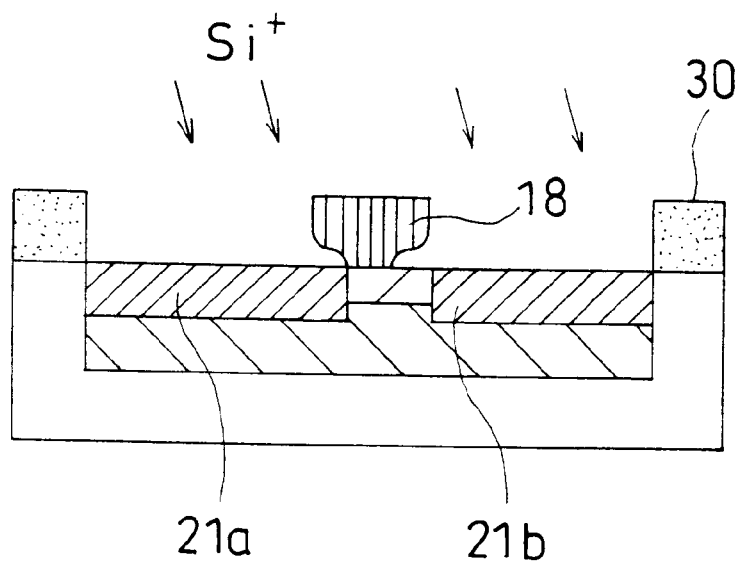
FIG. 14 is a cross-sectional view illustrating the structure of a compound semiconductor device formed in accordance with a modified step of the FIG. 6e step.
Figure 15A:
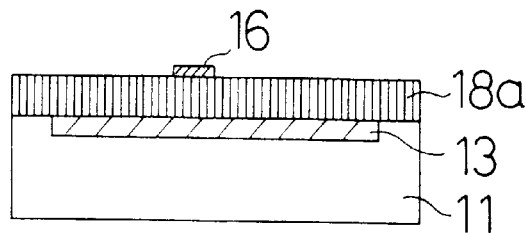
FIGS. 15a–15g are cross-sectional views illustrating steps of the fabrication of a compound semiconductor device formed in accordance with a conventional technique.
Figure 15B:
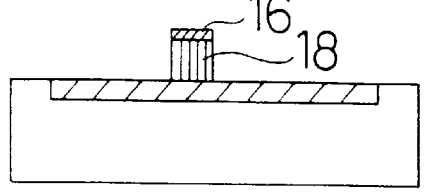
Figure 15C:
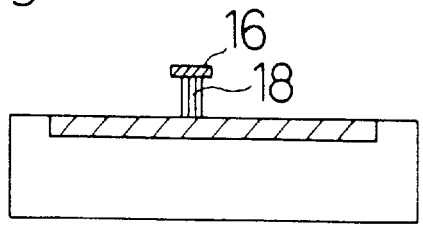
Figure 15D:
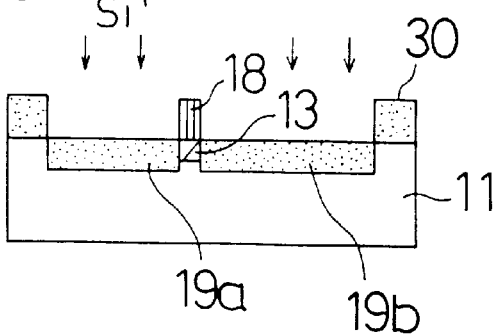
Figure 15E:
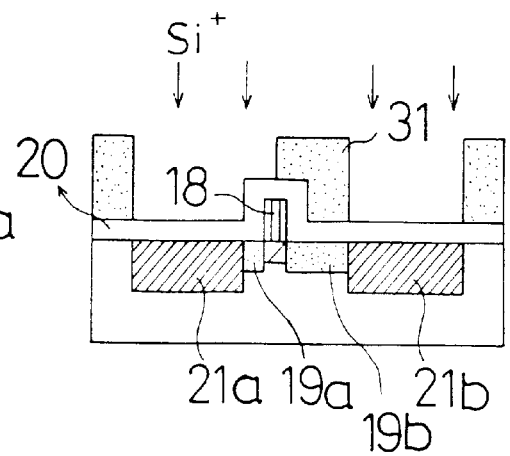
Figure 15F:
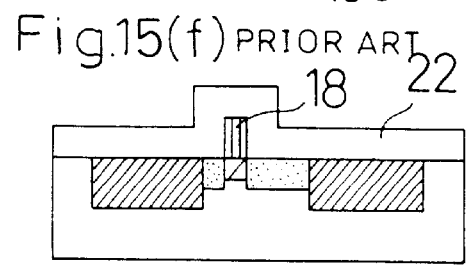
Figure 15G:
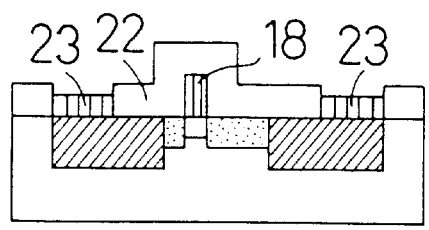

The fifth manner relates to the FIG. 7e fabrication step of the fourth embodiment (see FIG. 14). With regard to this fabrication step, it is possible to implant ions of Si at a high concentration in a direction greatly inclined towards the source, to form the SS n$^+$ layer 21a near the bottom of the gate electrode 18 and the DS n$^+$ layer 21b at a distance from the gate electrode 18. The FIG. 7f fabrication step is not carried out. The fabrication steps of FIGS. 7g–7i are carried out to fabricate a compound semiconductor device with a single impurity-diffused layer asymmetrically formed in the drain and source regions. The present manner, which uses a T-shaped gate electrode 18, achieves a device having the same characteristic as the second embodiment's compound semiconductor device with simple fabrication steps.

The masks 16 and 17 may be formed differently in material from each of the above-described embodiments. For example, the first mask 16 may be formed of $SiO_2$ and the second mask 17 may be formed of Al. Further, instead of using Al, Ni may be used for forming either the mask 16 or the mask 17. Even in such a case, it is possible to increase the $Ni/SiO^2$ etch selectivity, to achieve the same effect as each embodiment of the present invention.

It is preferred in each of the above-described embodiments that the dimensions of the Γ- or T-shaped gate electrode 18 fall in the following rages. Preferably, the gate electrode 18 has a gate length (i.e., a bottom lateral length) of from 0.05 μm up to 0.5 μm. The gate electrode 18 is likely to collapse at the time of its formation if the gate length<0.05 μm, and if the gate length exceeds 0.5 μm, then no improvements in the compound semiconductor device's operation rate are expected. It is preferred that the height of the gate electrode 18 is in the range between 0.3 μm and 1.0 μm. One reason is that if the height<0.3 μm it is difficult to form a T-shape gate electrode. The other reason is that if the height>1.0 μm the gate electrode 18 is likely to collapse at the time of its formation. Further, it is preferred that the top lateral length of the gate electrode 18 is 0.5 μm or more. This provides a greater top area to the gate electrode 18 thereby facilitating the formation of the low-resistivity metallic film 24 on the gate electrode 18.

The invention claimed is:

1. A semiconductor device comprising:
   a semiconductor substrate having an upper surface;
   a drain;
   a source; and
   a gate electrode having a flat upper surface, and at least a first side and second side surface,
   wherein said drain and said source are formed in said semiconductor substrate, and said gate electrode is formed on said substrate such that the distance between said first side and said second side of said gate electrode becomes continuously smaller as the distance from the upper surface of said gate electrode increases, at least one of said first side and said second side of said gate electrode forms a smooth curve surface in a cross section of said drain, said source and said gate electrode, which is orthogonal to the upper surface of the substrate, said gate electrode comprising a unitary member, said gate electrode comprising at least one conductive material.

2. A semiconductor device according to claim 1 further comprising:
   a channel layer formed in a region of said substrate including a region directly under said gate electrode;
   a source-side impurity-diffused layer formed in a region located laterally from a first side of said channel layer; and
   a drain-side impurity-diffused layer formed in a region located laterally from a second side of said channel layer.

3. A semiconductor device according to claim 2 wherein a distance between said source-side impurity-diffused layer and a source-side edge of said gate electrode's bottom is shorter than a distance between said drain-side impurity-diffused layer and a drain-side edge of said gate electrode's bottom.

4. A semiconductor device according to claim 2, wherein said source-side impurity-diffused layer has a source-side lightly-diffused layer adjacent to said first side of said channel layer, and said drain-side impurity-diffused layer has a drain-side lightly-diffused layer adjacent to said second side of said channel layer; and said source-side impurity-diffused layer further has a source-side heavily-diffused layer which is formed next to said source-side lightly-diffused layer, and said drain-side impurity-diffused layer further has a drain-side heavily-diffused layer which is formed next to said drain-side lightly-diffused layer.

5. A semiconductor device according to claim 4 wherein a distance between said source-side lightly-diffused layer and a source-side edge of said gate electrode's bottom is shorter than a distance between said drain-side lightly-diffused layer and a drain-side edge of said gate electrode's bottom.

6. A semiconductor device according to claim 5 wherein a distance between said source-side heavily-diffused layer and the source-side edge of said gate electrodes's bottom is shorter than a distance between said drain-side heavily-diffused layer and the drain-side edge of said gate electrode's bottom.

7. A semiconductor device according to claim 2, wherein said gate electrode is a Γ-shaped electrode with a vertical side-surface and an inclined side-surface;

said source-side impurity-diffused layer is formed laterally from the bottom of said vertical side-face; and said drain-side impurity-diffused layer is formed laterally from the bottom of said inclined side-face.

8. A semiconductor device according to claim 2 wherein said gate electrode has a cross section which has a top lateral length of 0.5 μm or more, a bottom lateral length falling in the range between 0.5 μm and 0.5 μm, and a height falling in the range between 0.3 μm and 1.0 μm.

\* \* \* \* \*